(12) United States Patent
Chang

(10) Patent No.: US 8,760,031 B2
(45) Date of Patent: Jun. 24, 2014

(54) ELECTROMECHANICAL TRANSDUCER AND METHOD FOR MANUFACTURING THE SAME WHICH SUPPRESSES LOWERING OF SENSITIVITY WHILE A PROTECTIVE LAYER IS FORMED

(75) Inventor: Chienliu Chang, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 572 days.

(21) Appl. No.: 12/615,070

(22) Filed: Nov. 9, 2009

(65) Prior Publication Data

US 2010/0123366 A1  May 20, 2010

(30) Foreign Application Priority Data

Nov. 19, 2008  (JP) ................. 2008-295799

(51) Int. Cl.
- *B06B 1/02* (2006.01)
- *H04R 19/00* (2006.01)
- *H04R 31/00* (2006.01)
- *H02N 11/00* (2006.01)

(52) U.S. Cl.
USPC ........... 310/300; 257/416; 257/419; 381/174; 367/181

(58) Field of Classification Search
USPC ............. 310/309, 300; 73/724; 367/181, 176; 381/191, 174; 600/459; 257/416, 419; 438/53
See application file for complete search history.

(56) References Cited

U.S. PATENT DOCUMENTS

| | | | | |
|---|---|---|---|---|
| 5,189,916 A * | 3/1993 | Mizumoto et al. | ............... | 73/724 |
| 5,471,723 A * | 12/1995 | Luder et al. | ................. | 29/25.41 |
| 6,493,288 B2 * | 12/2002 | Khuri-Yakub et al. | ....... | 367/181 |
| 6,571,445 B2 * | 6/2003 | Ladabaum | ................... | 29/25.35 |
| 6,606,911 B2 * | 8/2003 | Akiyama et al. | ................ | 73/718 |
| 7,074,634 B2 * | 7/2006 | Foglietti et al. | ................. | 438/50 |
| 7,087,023 B2 * | 8/2006 | Daft et al. | ..................... | 600/459 |
| 7,293,462 B2 * | 11/2007 | Lee et al. | ......................... | 73/649 |
| 7,493,821 B2 * | 2/2009 | Wang | .............................. | 73/718 |
| 7,512,038 B2 * | 3/2009 | Machida et al. | .............. | 367/181 |
| 7,667,374 B2 * | 2/2010 | Aono et al. | ..................... | 310/334 |
| 7,745,973 B2 * | 6/2010 | Bayram et al. | ................ | 310/328 |
| 7,839,722 B2 * | 11/2010 | Wagner et al. | ................ | 367/181 |
| 7,923,795 B2 * | 4/2011 | Kobayashi et al. | ........... | 257/416 |
| 7,940,603 B2 * | 5/2011 | Adachi et al. | ................. | 367/181 |
| 7,944,114 B2 * | 5/2011 | Yoshimura et al. | ........... | 310/309 |
| 8,327,521 B2 * | 12/2012 | Dirksen et al. | .................. | 29/594 |
| 2007/0222338 A1 * | 9/2007 | Aono et al. | .................... | 310/334 |
| 2008/0259725 A1 * | 10/2008 | Bayram et al. | .................... | 367/7 |
| 2010/0123366 A1 * | 5/2010 | Chang | .......................... | 310/300 |
| 2010/0207485 A1 * | 8/2010 | Dirksen et al. | ................ | 310/300 |

FOREIGN PATENT DOCUMENTS

JP  2006319712  * 11/2006  ............. H04R 31/00

OTHER PUBLICATIONS

Caronti et al., "Capacitive Micromachined Ultrasonic Transducer (CMUT) Arrays for Medical Imagining".*
Machine Translation of JP 2006-319712, "electrostatic capacitive ultrasonic transducer and manufacturing method thereof", Adachi et al., Nov. 24, 2006.*
Journal of Micromechanics and Microenginerring, vol. 17, 2007, p. 994-1001.

* cited by examiner

*Primary Examiner* — Burton Mullins
(74) *Attorney, Agent, or Firm* — Canon U.S.A., Inc. IP Division

(57) ABSTRACT

An electromechanical transducer of the present invention includes a first electrode, a vibrating membrane formed above the first electrode through a gap, a second electrode formed on the vibrating membrane, and an insulating protective layer formed on a surface of the second electrode side. A region where the protective layer is not formed is present on at least part of a surface of the vibrating membrane.

2 Claims, 6 Drawing Sheets

ELECTROMECHANICAL TRANSDUCER AND METHOD FOR MANUFACTURING THE SAME WHICH SUPPRESSES LOWERING OF SENSITIVITY WHILE A PROTECTIVE LAYER IS FORMED

BACKGROUND OF THE INVENTION

1. Field of the Invention The present invention relates to an electromechanical transducer and a method for manufacturing the electromechanical transducer.

2. Description of the Related Art Capacitive electromechanical transducers manufactured using a micromachining step have been actively investigated in recent years. A typical capacitive electromechanical transducer includes a lower electrode as a first electrode, a vibrating membrane supported so as to maintain a certain distance between the vibrating membrane and the lower electrode, and an upper electrode disposed on a surface of the vibrating membrane. Such a capacitive electromechanical transducer is used as, for example, a capacitive micromachined ultrasonic transducer (CMUT).

A CMUT can transmit and receive ultrasonic waves using a lightweight vibrating membrane and has good wideband characteristics in the liquid and air. Thus, a CMUT receives attention as an up-and-coming technology.

The operating principles of a CMUT will now be described. In the transmission of ultrasonic waves, low AC voltage is applied between the lower electrode and the upper electrode while being superposed on DC bias voltage. As a result, the vibrating membrane vibrates to generate ultrasonic waves. In the reception of ultrasonic waves, since the vibrating membrane is transformed due to ultrasonic waves, a signal is detected from the capacitance change between the lower electrode and the upper electrode caused by the transformation.

The sensitivity of a capacitive electromechanical transducer such as a CMUT depends on, for example, the distance (gap) between the electrodes, the rigidity of the vibrating membrane, an area of the electrode, and DC bias voltage. The higher DC bias voltage is, the higher the sensitivity becomes. In the case where a capacitive electromechanical transducer contacts the surface of a living body or living tissues in the body, an insulating protective layer needs to be disposed on a surface of the capacitive electromechanical transducer (refer to Journal of Micromechanics and Microengineering, Vol. 17, 2007, pp 994-1001).

SUMMARY OF THE INVENTION

As described above, to increase the electromechanical efficiency of a capacitive electromechanical transducer, higher DC bias voltage can be applied. In consideration of medical diagnosis, an insulating protective layer needs to be disposed on an exposed surface of a capacitive electromechanical transducer.

However, if the entire surface of the capacitive electromechanical transducer is coated with the protective layer, more than sufficient mass and rigidity are provided to the vibrating membrane. Because of such an unnecessary damping effect, the vibration frequency is shifted and the amount of displacement is decreased, which may lower the sensitivity.

Accordingly, the present invention suppresses lowering of sensitivity while the protective layer is formed.

An electromechanical transducer according to the present invention includes at least one element including a first electrode; a vibrating membrane formed above the first electrode through a gap; and a second electrode formed on the vibrating membrane; and an insulting protective layer formed on a surface of the vibrating membrane side of the element, wherein the protective layer covers a surface of the second electrode and a surface of wiring of the second electrode; and a region where the protective layer is not formed is present on at least part of a surface of the vibrating membrane.

A method for manufacturing an electromechanical transducer according to the present invention includes the steps of forming a first electrode; forming a vibrating membrane above the first electrode through a gap; forming a second electrode on the vibrating membrane; forming an insulating protective layer on a surface of the vibrating membrane side of the electromechanical transducer; and removing at least part of the protective layer formed on a surface of the vibrating membrane while leaving the protective layer formed on a surface of the second electrode and a surface of wiring of the second electrode.

According to the present invention, a decrease in sensitivity can be suppressed while a protective layer is formed. Specifically, even if an insulating protective layer is disposed on an exposed electrode surface, the effect on the rigidity of a vibrating membrane of an electromechanical transducer can be reduced. Accordingly, a decrease in element sensitivity can be suppressed.

Further features of the present invention will become apparent from the following description of exemplary embodiments with reference to the attached drawings.

BRIEF DESCRIPTION OF THE DRAWINGS

FIG. 4 is a top view of the electromechanical transducer of Example 1 according to the present invention.

DESCRIPTION OF THE EMBODIMENTS

Figure 1:
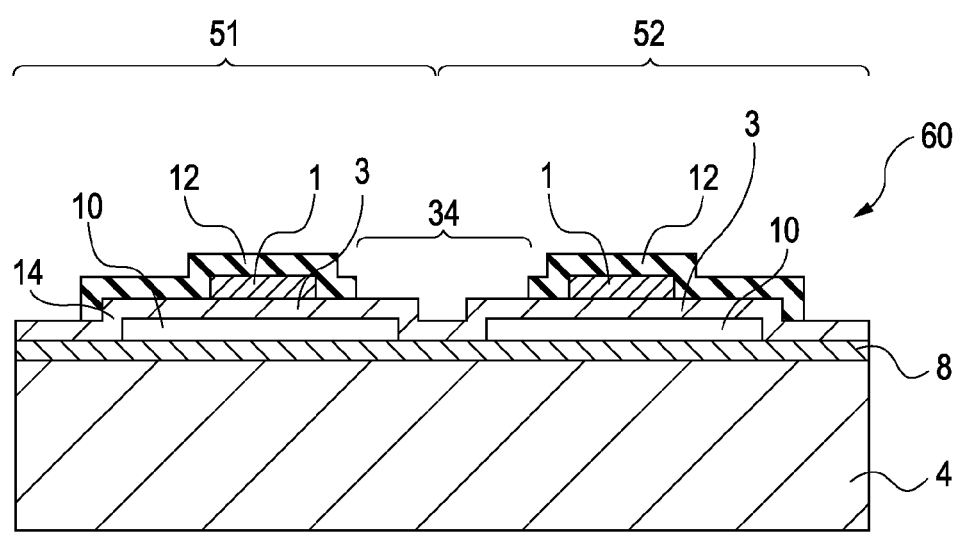
FIG. 1 is a sectional view showing a structure of an embodiment of an electromechanical transducer according to the present invention.

The present invention will now be described with reference to the attached drawings. FIG. 1 is a sectional view showing an example of an electromechanical transducer according to the present invention.

As shown in FIG. 1, an electromechanical transducer 60 of the present invention includes an element having a lower electrode 8 that is a first electrode, a vibrating membrane 3, and an upper electrode 1 that is a second electrode. Although FIG. 1 shows an example in which two elements 51 and 52 are formed, the number of elements is not limited to this and a desired number of elements may be formed. In the electromechanical transducer 60 of FIG. 1, the lower electrode 8 that is a first electrode is formed on a substrate 4. The vibrating membrane 3 is supported by a vibrating membrane supporting unit 14 so as to maintain a certain distance between the vibrating membrane 3 and the lower electrode 8. In other words, a cavity 10 that is a gap is formed so as to be surrounded by the lower electrode 8, the vibrating membrane 3 on which the upper electrode 1 that is a second electrode is formed, and the vibrating membrane supporting unit 14. A protective layer 12 is disposed on the vibrating membrane 3 and the upper electrode 1.

Figure 2A:
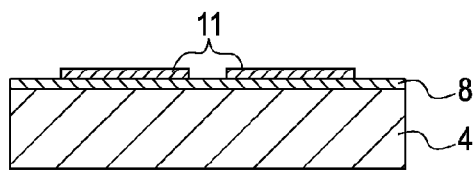
FIGS. 2A to 2E4 are diagrams showing manufacturing steps of Example 1 of the electromechanical transducer according to the present invention.
Figure 2A:
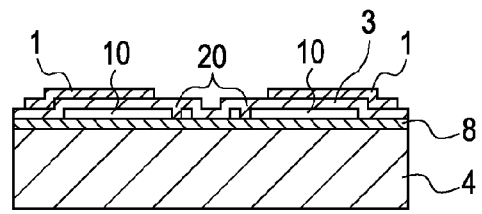
Figure 3:
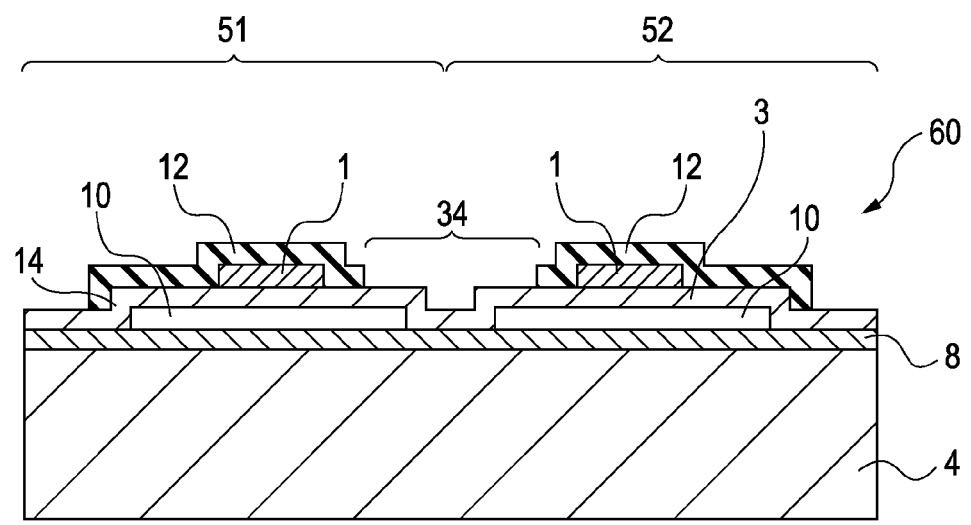
FIG. 3 is a sectional view of an electromechanical transducer of Example 1 according to the present invention.
Figure 6A:
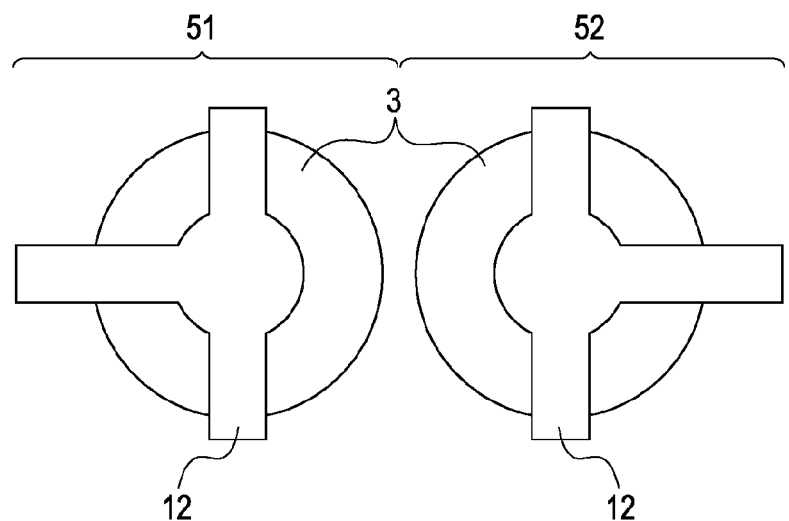
FIGS. 6A and 6B are respectively a top view and a perspective view of an electromechanical transducer of Example 3 according to the present invention.
Figure 6B:
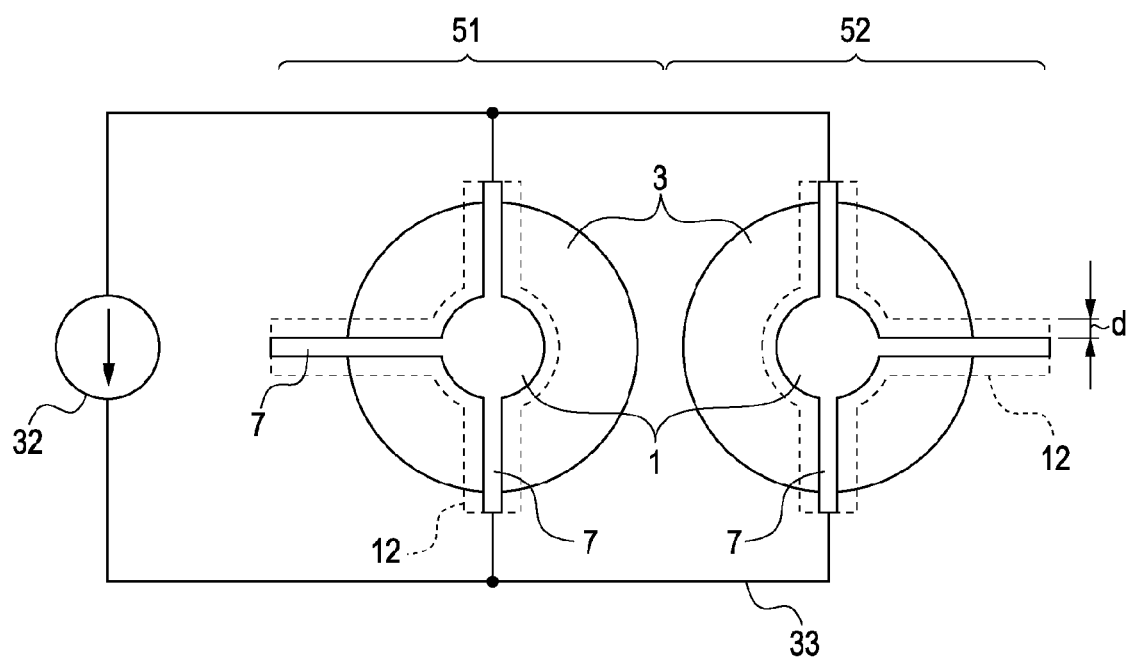

In the present invention, a surface of the upper electrode and a surface of wiring of the upper electrode are covered with the protective layer, and a region 34 where the protective layer is not formed is present on at least part of a surface of the vibrating membrane. The wiring of the upper electrode denoted by reference numeral 7 in FIGS. 2E3 and 6B is used to electrically connect the upper electrode to the next upper electrode or extract a signal of the upper electrode.

A semiconductor substrate, an insulator substrate, or a semiconductor substrate having an insulating surface is exemplified as the substrate used in the present invention. When the substrate is a semiconductor substrate such as a silicon substrate, the substrate may also function as a lower electrode.

The upper electrode 1 can be composed of a material selected from a metal, low resistivity amorphous Si, and a low resistivity oxide semiconductor.

The lower electrode 8 needs only to be composed of a low resistivity material. Examples of the material include a doped monocrystalline Si substrate, a doped polycrystalline Si film, a monocrystalline Si substrate whose doped region is used as a lower electrode, doped amorphous Si, an oxide semiconductor, and a metallic film. As described above, the substrate may also function as a lower electrode. When an electric signal of elements is detected, it is desirable to reduce a potential drop caused by the lower electrode 8. Thus, when the lower electrode 8 is formed of Si, the sheet resistance is preferably 20.0Ω/square or less, more preferably 5.0Ω/square or less, most preferably 1.0Ω/square or less.

The vibrating membrane 3 is desirably composed of a material having a high dielectric constant. Thus, at least one material selected from high dielectric constant materials such as a $Si_XN_Y$ film, a $Si_XO_Y$ film, and a $SiN_XO_Y$ film used for semiconductor process, $Y_2O_3$, HfO, HfAlO, and BST ((Ba, Sr)$TiO_3$) can be used as the material of the vibrating membrane 3.

Although FIG. 1 shows a case where one upper electrode is formed in a single element, a plurality of upper electrodes may be formed in a single element in the present invention. In this case, the plurality of upper electrodes in the element are electrically connected to each other in parallel. In addition, a plurality of lower electrodes may be formed in a single element and electrically connected to each other in parallel. Even if a single element has at least one of the plurality of upper electrodes and the plurality of lower electrodes, the element outputs one signal. In other words, even if there is at least one of the plurality of upper electrodes and the plurality of lower electrodes, the element outputs one signal by electrically connecting the plurality of upper electrodes or the plurality of lower electrodes in parallel.

To increase the electromechanical coefficient of the capacitive electromechanical transducer, DC bias voltage is normally applied between the upper electrode 1 and the lower electrode 8 during its operation. The vibrating membrane 3 is displaced toward the lower electrode due to the DC bias voltage. However, once the DC bias voltage exceeds a certain voltage, the vibrating membrane 3 contacts the substrate (collapses), which may instead decrease the electromechanical coefficient. The certain voltage is called collapse voltage. The bias voltage is adjusted so as not to generate such collapse voltage. To prevent a short circuit when collapse voltage is generated, at least one of the upper electrode and the lower electrode can be covered with an insulating layer.

In the present invention, when a region where the protective layer is not formed is present on at least part of a surface of the vibrating membrane, a decrease in sensitivity can be suppressed compared with the case where a protective layer covers the entire vibrating membrane. As shown in FIG. 1, when a plurality of elements are formed, the region where the protective layer is not formed is desirably present between the upper electrodes (second electrodes) of the elements adjacent to each other. Such a structure can suppress the crosstalk between the elements adjacent to each other. The crosstalk between the elements adjacent to each other means that, for example, the displacement of the vibrating membrane 3 of the element 51 in FIG. 1 affects the displacement of the vibrating membrane 3 of the element 52.

As long as the protective layer 12 covers the upper electrode and the wiring, the protective layer 12 functions as an electrical insulator. The protective layer covering a portion (vibrating membrane) other than the upper electrode and the wiring provides more than sufficient mass and rigidity to the vibrating membrane 3, which decreases the amount of vibration displacement, thereby lowering the sensitivity. Thus, the amount of a protective layer that covers a vibrating membrane and does not contribute to electrical insulating can be reduced as much as possible. For this reason, the protective layer can cover only "the vicinity of the upper electrode (the second electrode) and the vicinity of wiring of the upper electrode (wiring of the second electrode)" and should not be formed on a surface of the vibrating membrane except in such vicinities. In the present invention, "the vicinity of the upper electrode and the vicinity of wiring of the upper electrode" is a region where "a region of the upper electrode and the wiring of the upper electrode" and "the periphery thereof" are connected to each other. "The periphery thereof" is a region where the distance from "the region of the upper electrode and the wiring of the upper electrode" is "equal to or shorter than twice the wiring width". "The periphery thereof" is desirably "a region where the distance is equal to or shorter than twice the wiring width" and "a region whose width is equal to or larger than the thickness of the protective layer". This is because, when the width is equal to or larger than the thickness of the protective layer, the protective layer can sufficiently cover not only the surface of the upper electrode and the wiring thereof (upper surface in the sectional view) but also the side (side surface in the sectional view).

The main role of the protective layer is electrical insulating between the electromechanical transducer and the outside, and can be composed of a biocompatible material (material that avoids causing a reaction with a living body). Thus, the material of the protective layer can be a polymer material having insulation properties. Examples of biocompatible polymer resin films include polydimethylsiloxane (PDMS) films, parylene films, polyimide films, and poly(methyl methacrylate) (PMMA) resin films. Instead of the polymer resin films, inorganic films such as $Si_XN_Y$ films, $Si_XO_Y$ films, and $SiN_XO_Y$ films can be used.

The protective layer is patterned by a method in which, after a protective layer is formed on surfaces of a vibrating membrane and an upper electrode, the protective layer is removed while a desired region thereof is left. Typical photolithography can be used (refer to Example 1). The protective layer can be easily formed using a photosensitive polymer resin (refer to Example 2) or a thermosetting resin (refer to Example 3).

In the application to medical diagnosis, a coupling solution is used between the electromechanical transducer and a living body to match the impedance. When the solution enters a hollow cavity, the vibrating membrane can hardly vibrate because the compressibility of liquid is much lower than that of gas. Therefore, the cavity can be sealed to maintain the life and performance of elements. Furthermore, if air or gas is encapsulated in the cavity, the sensitivity may drop. The cavity can be vacuum-sealed.

EXAMPLES

Examples of the present invention will now be described with reference to the drawings.

Example 1

FIGS. 2A to 2E2 and 2E4 and 2E3 are respectively sectional views and a top view describing the steps of Example 1 of a method for manufacturing the electromechanical transducer according to the present invention. To simplify the following description, a patterning step means all steps that include a photolithography step including application of a photoresist to a substrate, drying, exposure, and development; an etching step; a step of removing the photoresist; a step of cleaning the substrate; and a drying step performed in sequence. Although a substrate 4 of this Example is composed of Si as an example, a substrate composed of another material can be used. For instance, an insulating substrate composed of $SiO_2$ or sapphire can be used. FIGS. 2A to 2E2 and 2E4 and 2E3 are respectively sectional views and a top view in which two elements adjacent to each other are formed. However, the number of elements is not limited to two, and any number of elements can be formed using the same steps.

In the manufacturing method of this Example, first, a Si substrate 4 is prepared and cleaned. A lower electrode 8 is then formed on a surface of the Si substrate 4. As shown in FIG. 2A, a sacrificial layer 11 is formed on the lower electrode 8 and patterned. In this Example, the lower electrode 8 that is a first electrode is composed of Ti (thickness: about 500 nm) and the sacrificial layer 11 is composed of Cr (thickness: about 200 nm).

The distance between the electrodes (distance between the lower electrode 8 and an upper electrode described below) is determined in accordance with the thickness of the sacrificial layer 11. The thinner the sacrificial layer 11 is, the higher the electromechanical coefficient of the elements becomes. However, if the distance between the electrodes is too short, the probability of dielectric breakdown is increased. Therefore, the thickness of the sacrificial layer 11 is preferably 5 to 4000 nm, more preferably 10 to 1000 nm, most preferably 20 to 500 nm.

In this Example, a Cr film formed by sputtering is used as the sacrificial layer 11. The Cr film is patterned by wet-etching. A solution containing $(NH_4)_2Ce(NO_3)_6$ and $HClO_4$ can be used as a Cr etching solution. Since the etching solution slowly etches Ti of the lower electrode 8, it has high etching selectivity.

Figure 2B:
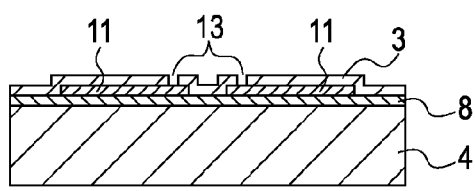
Figure 2B:
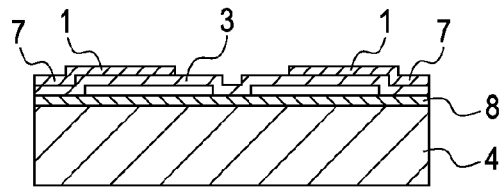

As shown in FIG. 2B, a nitride film $SiN_X$ that is a vibrating membrane 3 (thickness: about 600 nm) is formed by plasma enhanced chemical vapor deposition (PECVD). Subsequently, the nitride film $SiN_X$ is patterned by reactive ion etching (RIE) using a $CF_4$ gas. In this process, an entrance 13 of an etching solution can be formed at the same time. To keep an area of the vibrating membrane 3, the entrance 13 of an etching solution can be disposed in the periphery or on the end of the vibrating membrane so as not to affect vibration (not shown).

Figure 2C:
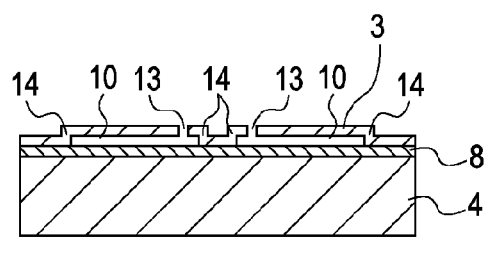
Figure 2C:
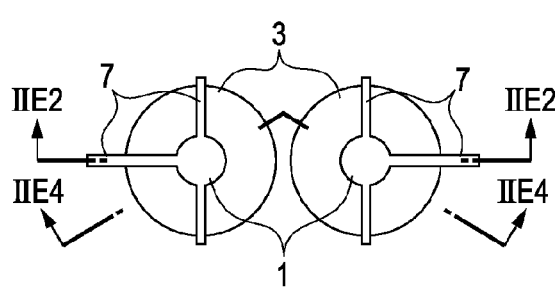

As shown in FIG. 2C, an etching solution is introduced from the entrance 13 of an etching solution by immersing the sample in the etching solution to remove the sacrificial layer 11. Although Cr of the sacrificial layer 11 is etched with the mixed acid solution of $(NH_4)_2Ce(NO_3)_6$ and $HClO_4$, a Ti layer of the lower electrode 8 is hardly etched.

Immediately after the wet-etching of the sacrificial layer 11, the sample is immersed in pure water several times to prevent sticking of the vibrating membrane to the lower electrode caused by liquid surface tension. The sample is dried by a supercritical drying method using liquid $CO_2$ to form a cavity 10. Part of the nitride film formed in the same step as the vibrating membrane 3 becomes a supporting unit 14 by etching the sacrificial layer 11.

Figure 2D:
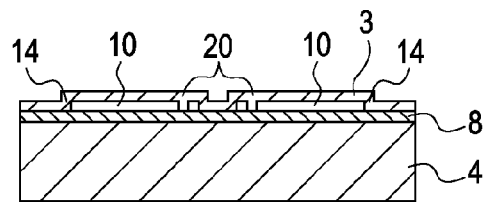
Figure 2D:
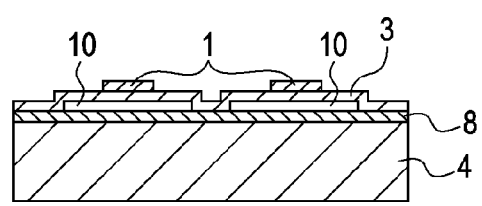

As shown in FIG. 2D, a nitride film $SiN_X$ is formed by PECVD again to seal the entrance 13 of an etching solution. As a result, a sealing portion 20 is formed.

As shown in FIG. 2E1, an Al film is formed on the vibrating membrane 3 with a thickness of 200 nm and patterned. The Al film is an upper electrode 1 that is a second electrode. Because the upper electrode 1 is electrically insulated from the substrate 4 and the lower electrode 8 by the vibrating membrane 3 that is the nitride film $SiN_X$, an element structure similar to parallel plate is formed.

To avoid a short circuit caused when the upper and lower electrodes are collapsed, at least one of the upper electrode and the lower electrode is desirably coated with an insulating layer. In this Example, since the vibrating membrane 3 also functions as the insulating layer, the process can be simplified.

Figure 4:
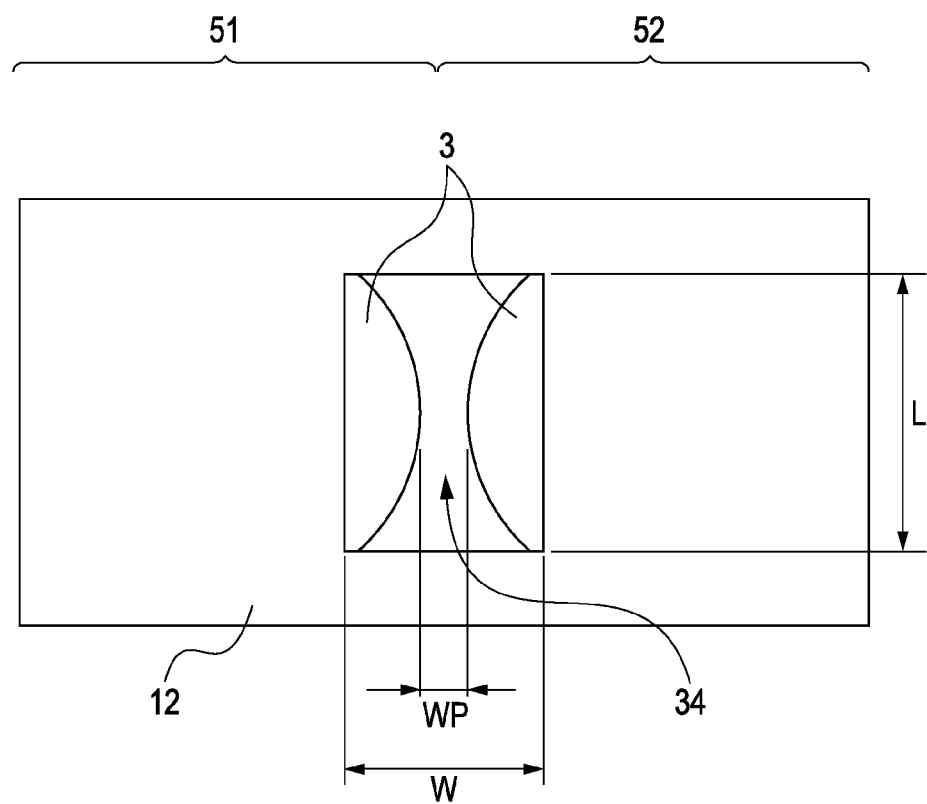

FIG. 2E2 is a schematic view in which the sealing portion is omitted from FIG. 2E1 for simplification. In the following description, simplified drawings are used as in FIG. 2E2. FIG. 2E3 is a top view of two elements of FIG. 2E2. FIG. 2E2 is a sectional view taken along line IIE2-IIE2 of FIG. 2E3. FIG. 2E4 is a sectional view taken along line IIE4-IIE4 of FIG. 2E3. Wiring 7 of the upper electrode shown in FIGS. 2E2 and 2E3 are used to electrically connect the upper electrodes or extract a signal of the upper electrode 1. FIG. 2E3 shows an example in which the upper electrodes adjacent to each other are not connected to each other through wiring.

As shown in FIG. 3, an insulating film is formed on the upper electrode 1 and patterned to form a protective layer 12. FIG. 3 is a schematic view showing the same section as that of FIG. 2E4. In this Example, a parylene film (parylene-C(poly (monochloro-p-xylylene))) having a thickness of 2 μm and formed with a commercially available apparatus (Product name: PDS2010 available from Parylene Japan LLC) is described as an example.

FIG. 4 is a top view corresponding to FIG. 3. As shown in FIGS. 3 and 4, the parylene protective layer 12 is etched by plasma RIE dry-etching using an oxygen gas. A photoresist (e.g., AZ4620 available from Hoechst Celanese Corporation) can be used as the etching mask. The RIE can be processed under the conditions under which pressure is 10 to 1000 mTorr, RF power is 100 to 1000 W, and an oxygen flow rate is 10 to 300 sccm. Under the above-described RIE process conditions, the etching selectivity ratio of parylene to photoresist AZ4620 is about 0.7 to 2.0. Therefore, by applying photoresist AZ4620 with a thickness of 2.5 μm or more, the parylene protective layer can be patterned.

Since precise dry-etching can be performed by plasma RIE with an oxygen gas, a desired pattern of the parylene protective layer 12 can be precisely formed without causing damage to the vibrating membrane 3 composed of $SiN_X$ that is a base. Furthermore, the parylene protective layer 12 can be patterned by plasma RIE with an oxygen gas using the vibrating membrane 3 as an etching stop layer. Thus, two elements adjacent to each other (first element 51 and second element 52) can be formed as shown in FIGS. 3 and 4.

As shown in FIG. 4, a space similar to a groove is present between the first element 51 and the second element 52 as a region 34 where the protective layer 12 is not formed. Table 1 shows each size.

TABLE 1

| Parylene protective layer | Young's modulus (GPa) | 2.70E+09 |
|---|---|---|
| | Density (g/cm$^3$) | 1.289 |
| | Poison ratio | 0.4 |
| | Thickness (μm) | 2 |
| | Width of groove W (μm) | 5 |
| | Length of groove L (μm) | 10 |
| SiN$_X$ vibrating membrane | Young's modulus (GPa) | 1.60E+11 |
| | Density (g/cm$^3$) | 2.5 |
| | Poison ratio | 0.253 |
| | Thickness (μm) | 1 |
| | Length of element (μm) | 20 |
| | Width of element (μm) | 20 |
| Distance between vibrating membranes adjacent to each other | WP (μm) | 4 |

The amount of displacement of the vibrating membrane is calculated under the conditions shown in Table 1 using commercially available finite element software (Ansys). Table 2 shows the results. In Table 2, the amount of displacement of the film center of the first element is $\delta_1$ and the amount of displacement of the film center of the second element is $\delta_2$. The rigidity of the electrode is omitted in this calculation.

TABLE 2

| Case | Amount of displacement of the film center $\delta_1$ | Ratio of the amount of displacement of the film center of the first element to that of the second element 10 log ($\delta_2/\delta_1$) |
|---|---|---|
| Without groove | for example, $\delta_1$ is set to be about 1 nm | −23.5 dB |
| With groove | about 0.5% increase | −27.8 dB (decrease 0.37 times) |

As shown in Table 2, by disposing the groove that is a region where the protective layer 12 is not formed, the amount of displacement of the vibrating membrane was increased by about 0.5% from the calculation. Although the amount of displacement was increased by 0.5% in this Example, the amount of displacement is further increased by widening the region where the protective layer 12 is not formed, which can improve the sensitivity.

Furthermore, by disposing the groove, the amount of displacement of the vibrating membrane caused by the elements adjacent to each other was decreased 0.37 times. In other words, it is clear that the crosstalk between the elements can be suppressed with the presence of a region where the protective layer is not formed, the region being provided between the upper electrodes.

FIGS. 2A to 4 show a structure and manufacturing steps of the two elements (first element 51 and second element 52) adjacent to each other according to this Example. However, when a large-area element array is manufactured, the elements shown in the drawings may be disposed on a substrate regularly or periodically.

Example 2

In this Example, an electromechanical transducer is manufactured by the same method as that of Example 1 until the steps shown in FIGS. 2A to 2E4. Subsequently, a protective layer is patterned as shown in a top view of FIG. 5. The protective layer is composed of photosensitive polyimide (e.g., photosensitive polyimide available from Toray Industries, Inc., Product name: Photoneece). With such a material, the protective layer can be directly patterned by precise lithography. Thus, an electromechanical transducer can be easily manufactured compared with the case where an electromechanical transducer is manufactured by the etching method described in Example 1.

Figure 5:
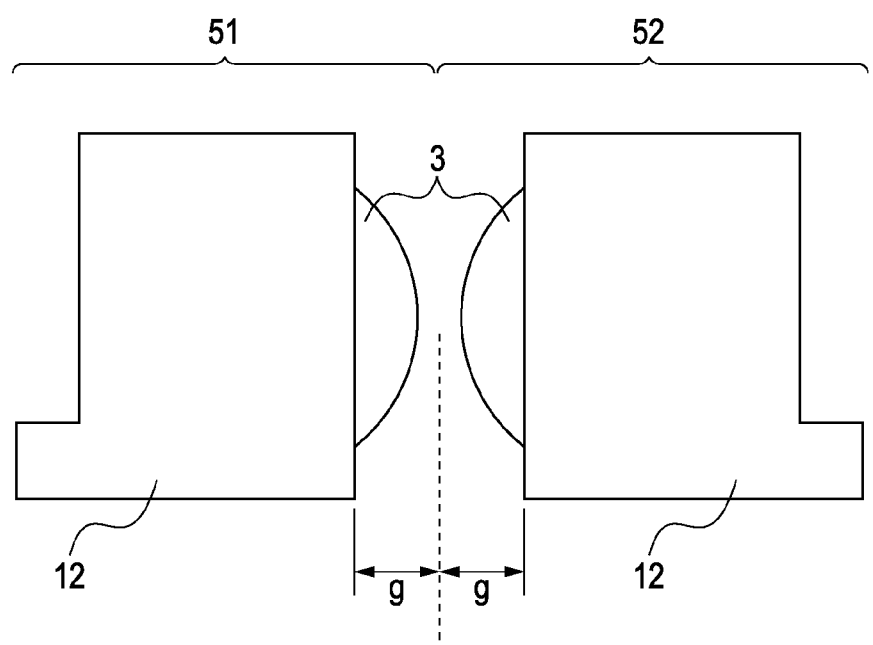
FIG. 5 is a top view of an electromechanical transducer of Example 2 according to the present invention.

In this Example, the protective layer 12 between the upper electrodes of the two elements adjacent to each other (first element 51 and second element 52) is completely removed as shown in FIG. 5. The larger the distance 2 g is, the more the crosstalk of the elements adjacent to each other can be suppressed.

Example 3

In this Example, an electromechanical transducer is manufactured by the same method as that of Example 1 until the steps shown in FIGS. 2A to 2E4. Subsequently, a protective layer 12 is patterned as shown in a top view of FIGS. 6A and 6B. FIG. 6B is a perspective view and the protective layer 12 of FIG. 6A is shown in perspective in FIG. 6B.

A thermosetting resin (e.g., Product name: OGSOL SI-20 available from Osaka Gas Chemicals Co., Ltd.) is applied as the protective layer. Subsequently, an electrical signal is extracted from the upper electrode 1 through a line 33, the line 33 being connected to an external current source 32. When an electric current is applied to two ends of the upper electrode 1, the upper electrode 1 itself functions as a resistance wire and generates heat. Consequently, the thermosetting resin near the upper electrode can be cured. Particularly when the vibrating membrane 3 is a poor thermal conductor, for example, a nitride film SiN$_X$, the heat is concentrated in an area near the upper electrode 1 (thermal conductor) that generates heat and the wiring 7 of the upper electrode. Thus, a protective layer having a shape shown in FIGS. 6A and 6B can be formed.

In this Example, the protective layer can be patterned by itself due to the heat generated by the upper electrode 1 and the wiring 7 of the upper electrode. Therefore, the upper electrode and the wiring of the upper electrode can be insulated while the size of a protective region is minimized. That is to say, since the protective layer is not formed on a surface of the vibrating membrane except for the vicinity of the upper electrode and the vicinity of wiring of the upper electrode, a decrease in sensitivity can be minimized and crosstalk can also be suppressed. Thus, the protective layer has the most desirable pattern. A step of forming a patterning mask of the protective layer can be skipped by such a local self-heating method. Consequently, the process is easily performed.

As shown in a top view of FIG. 6B, the vicinity of the upper electrode and the vicinity of wiring of the upper electrode is a region where "a region of the upper electrode and the wiring of the upper electrode" and "the periphery thereof (a region having width d in FIG. 6B)" are connected to each other. The width d can be equal to or larger than the thickness of the protective layer. This is because, when the width d is equal to or larger than the thickness of the protective layer, the protective layer can sufficiently cover not only the surface of the upper electrode and the wiring of the upper electrode (upper surface) but also the side (side surface).

In the three Examples described above, a sacrificial layer having a thickness that is equal to a desired distance between electrodes (distance between the upper electrode and the lower electrode) is disposed and a vibrating membrane is formed thereon. Subsequently, a cavity is formed by a method for removing the sacrificial layer (surface type). However, a vibrating membrane supporting unit is disposed on a substrate and a cavity may be formed by a method for bonding a silicon on insulator (SOI) substrate (bonding type).

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-295799 filed Nov. 19, 2008, which is hereby incorporated by reference herein in its entirety.

What is claimed is:

1. An electromechanical transducer comprising:
a plurality of elements, each element including:
   a first electrode;
   a vibrating membrane formed above the first electrode through a cavity;
   a supporting unit formed to support the vibrating member; and
   a second electrode formed on the vibrating membrane; and
   an insulating protective layer formed to cover at least a whole area of a surface of the second electrode and wiring of the second electrode,
wherein the vibrating membrane, the supporting unit and the insulating protective layer comprise silicon nitride film,
wherein the plurality of elements include a first element and a second element adjacent to each other,
wherein there is a region, between the supporting unit of the first element and the supporting unit of the second element, where the insulating protective layer is not formed, and
wherein a thickness of the silicon nitride film at the region is thinner than a thickness of the silicon nitride film above the cavity, which corresponds to a combined thickness of the vibrating membrane under the second electrode and the insulating protective layer above the second electrode.

2. The electromechanical transducer according to claim 1, wherein the first electrode is formed above a silicon substrate.

* * * * *